(12) United States Patent
Takase (10) Patent No.: US 9,548,717 B2
(45) Date of Patent: Jan. 17, 2017

(54) PIEZOELECTRIC RESONATOR DEVICE USING TEMPERATURE SENSOR UNIT

(71) Applicant: DAISHINKU CORPORATION, Kakogawa-shi, Hyogo (JP)

(72) Inventor: Hidenori Takase, Kakogawa (JP)

(73) Assignee: DAISHINKU CORPORATION, Kakogawa-shi (JP)

( * ) Notice: Subject to any disclaimer, the term of this patent is extended or adjusted under 35 U.S.C. 154(b) by 0 days.

(21) Appl. No.: 14/440,720

(22) PCT Filed: Nov. 13, 2013

(86) PCT No.: PCT/JP2013/080690
§ 371 (c)(1),
(2) Date: May 5, 2015

(87) PCT Pub. No.: WO2014/077278
PCT Pub. Date: May 22, 2014

(65) Prior Publication Data
US 2015/0295557 A1     Oct. 15, 2015

(30) Foreign Application Priority Data
Nov. 16, 2012   (JP) ................................. 2012-252500

(51) Int. Cl.
| H01L 41/04 | (2006.01) |
| H03H 9/10 | (2006.01) |
| H03H 9/05 | (2006.01) |
| H03H 9/08 | (2006.01) |

(52) U.S. Cl.
CPC ............ *H03H 9/10* (2013.01); *H03H 9/0552* (2013.01); *H03H 9/08* (2013.01); *H03H 9/1021* (2013.01)

(58) Field of Classification Search
CPC ....... H03H 9/0552; H03H 9/08; H03H 9/1021
USPC ........................................................ 310/344
See application file for complete search history.

(56) References Cited

U.S. PATENT DOCUMENTS

| 6,229,249 B1 | 5/2001 | Hatanaka et al. | |
| 6,229,404 B1* | 5/2001 | Hatanaka ................. | H03B 5/04 257/698 |
| 2002/0135429 A1* | 9/2002 | Akagawa ................. | H03B 5/32 331/68 |

(Continued)

FOREIGN PATENT DOCUMENTS

| JP | H07-170049 A | 7/1995 |
| JP | H11-017326 A | 1/1999 |

(Continued)

*Primary Examiner* — J. San Martin
(74) *Attorney, Agent, or Firm* — Marvin A. Motsenbocker; American Patent Works (57) ABSTRACT

A deviation in mounting a temperature sensor unit is eliminated. In a second cavity 47 for mounting a temperature sensor unit 3 of a base 4, exposed electrodes 6 that intersect at least an internal wall surface 474 of a second wall portion 45 are formed so as to be exposed within the second cavity 47. The exposed electrodes 6 include a pair of temperature sensor electrode pads 621 and 622 to which the temperature sensor unit 3 is bonded via a solder 13. The solder 13 is formed so as to cover an entire surface of the exposed electrodes 6 including the temperature sensor electrode pads 621 and 622 to which the temperature sensor unit 3 is bonded.

13 Claims, 4 Drawing Sheets (56) References Cited

U.S. PATENT DOCUMENTS

2013/0187723 A1\* 7/2013 Harima .................... H03B 5/36
　　　　　　　　　　　　　　　　　　　　　　　331/158

FOREIGN PATENT DOCUMENTS

| JP | 2000-077942 A | 3/2000 |
| JP | 2012-119911 A | 6/2012 |
| JP | 2012-142691 A | 7/2012 |
| JP | 2012-160875 A | 8/2012 |

\* cited by examiner

PIEZOELECTRIC RESONATOR DEVICE USING TEMPERATURE SENSOR UNIT

TECHNICAL FIELD

The present invention relates to a piezoelectric resonator device.

BACKGROUND ART

A piezoelectric resonator device is an electronic device in which are hermetically sealed driving electrodes of a piezoelectric resonator plate that cause piezoelectric resonance. Examples of the piezoelectric resonator device include a crystal oscillator, a crystal resonator and the like. This type of piezoelectric resonator device is constituted by a base made of a ceramic material and a lid made of a metal material. A housing of the piezoelectric resonator device is formed as a package having a rectangular parallelepiped shape. In an internal space of the package, the piezoelectric resonator plate is bonded to and held on the base with a conductive adhesive made of a fluid material. In the piezoelectric resonator device, the piezoelectric resonator plate in the internal space of the package is hermetically sealed by the base and the lid bonded to each other (see, for example, Patent Document 1).

The piezoelectric resonator device described in Patent Document 1 includes a thermistor element for use as a temperature sensor unit. In the piezoelectric resonator device, the base is constituted by: a bottom portion; a first wall portion extending upward from the bottom portion along the outer periphery of one main surface of the base; and a second wall portion extending downward from the bottom portion along the outer periphery of the other main surface of the base. Thus, the base is formed so as to have an H-shape in cross-section. The base includes a first cavity surrounded by the bottom portion and the first wall portion. The piezoelectric resonator plate is disposed in the first cavity. The base also includes a second cavity surrounded by the bottom portion and the second wall portion. The thermistor element is disposed in the second cavity.

PRIOR ART REFERENCE

Patent Document

[Patent Document 1] JP 2012-119911 A

SUMMARY OF INVENTION

Problems to be Solved by Invention

In the piezoelectric resonator device described in Patent Document 1, a conductive bonding material is applied to thermistor element mounting pads in the second cavity, thus, the thermistor element is bonded onto the thermistor element mounting pads via the conductive bonding material. When applying the conductive bonding material to the thermistor element mounting pads, a positional deviation in its application results in a positional deviation in mounting the thermistor element on the thermistor element mounting pads.

In consideration of the above problem, an object of the present invention is to provide a piezoelectric resonator device without deviation in mounting a temperature sensor unit.

Means for Solving Problems

In order to achieve the above object, a piezoelectric resonator device according to the present invention includes: a base for mounting a piezoelectric resonator plate; and a lid for hermetically sealing the piezoelectric resonator plate. The piezoelectric resonator device is constituted by: a bottom portion; a first wall portion extending upward from the bottom portion along an outer periphery of one main surface of the base; and a second wall portion extending downward from the bottom portion along an outer periphery of the other main surface of the base. A first cavity is formed by being surrounded by the bottom portion and the first wall portion so as to mount the piezoelectric resonator plate, and a second cavity is formed by being surrounded by the bottom portion and the second wall portion so as to mount a temperature sensor unit as a temperature detecting element. On a bottom surface of the second cavity, exposed electrodes that intersect at least an internal wall surface of the second wall portion are formed so as to be exposed within the second cavity. The exposed electrodes include a pair of temperature sensor electrode pads to which the temperature sensor unit is bonded via a fluid conductive bonding material. The conductive bonding material is formed so as to cover an entire surface of the exposed electrodes including the temperature sensor electrode pads to which the temperature sensor unit is bonded. As an example, a thermistor element is used as the temperature sensor unit here. However, the present invention is not limited thereto. For example, a unit in which the thermistor element is embedded, a diode, a transistor and the like may be used.

With the present invention, it is possible to eliminate a deviation in mounting the temperature sensor unit. That is, in the present invention, the exposed electrodes are formed on the bottom surface of the second cavity so as to be exposed within the second cavity. The exposed electrodes include the pair of temperature sensor electrode pads. The conductive bonding material is formed so as to cover the entire surface of the exposed electrodes including the temperature sensor electrode pads to which the temperature sensor unit is bonded. Thus, regardless a position on which the conductive bonding material is applied, the temperature sensor unit can be mounted on a desired position. Especially, the present invention is suitable for mounting the temperature sensor unit such as a general-purpose thermistor element in the second cavity corresponding to downsizing of the piezoelectric resonator device.

In the above-described configuration, preferably, the pair of temperature sensor electrode pads are formed so as to have a same shape. When nearest sides facing each other of the respective temperature sensor electrode pads in the second cavity are each referred to as a near end edge, and farthest sides opposed to each other of the respective temperature sensor electrode pads in the second cavity are each referred to as a far end edge, and when a distance from the near end edge to the far end edge of each of the temperature sensor electrode pads is represented by D1 and a distance from the far end edge to the nearest internal wall surface of the second cavity is represented by D2, then a relational expression of $2.85 \leq D1/D2 \leq 15.67$ may be satisfied in the second cavity.

In the present configuration, when D1/D2 equals to 2.85, 5.00, 5.25, 5.33, 9.00 or 15.67, it was confirmed that no deviation occurs in mounting the temperature sensor unit on the temperature sensor electrode pads.

In the above-described configuration, preferably, the pair of temperature sensor electrode pads are formed so as to have a same rectangular shape. When nearest sides facing each other of the respective temperature sensor electrode pads in the second cavity are each referred to as a near end edge, and farthest sides opposed to each other of the respective temperature sensor electrode pads in the second cavity are each referred to as a far end edge, then each outer periphery of the pair of temperature sensor electrode pads may be made up of: a first side including the near end edge; a second side including the far end edge; and a pair of sides for connecting between the corresponding first side and the corresponding second side. The exposed electrodes may include respective extracted portions each extracted toward the nearest internal wall surface of the second cavity from the corresponding far end edge of the pair of temperature sensor electrode pads. In the temperature sensor electrode pads, when a distance from the far end edge to the nearest internal wall surface of the second cavity is represented by D2, and when a width of the extracted portion is represented by W1, then a relational expression of W1 >D2 may be satisfied in the second cavity.

Since the relational expression of W1 >D2 is satisfied in the second cavity, the conductive bonding material easily flows (spreads) on the exposed electrodes when the temperature sensor unit is bonded to the temperature sensor electrode pads via the conductive bonding material. As a result, a bonding strength of the temperature sensor unit to the temperature sensor electrode pads can be increased. Especially, the bonding strength is further increased in an aspect in which the conductive bonding material is formed on a side surface of the temperature sensor unit bonded to the temperature sensor electrode pads (i.e., in a state in which the conductive bonding material spreads onto the side surface of the temperature sensor unit).

On the other hand, when the relational expression of W1≤D2 is satisfied in the second cavity, the conductive bonding material is less likely to flow (spread) on the exposed electrodes when the temperature sensor unit is bonded to the temperature sensor electrode pads via the conductive bonding material. As a result, the bonding strength of the temperature sensor unit to the temperature sensor electrode pads is decreased. This relates to the fact that when W1 is relatively small to D2, the conductive bonding material is less likely to spread on the temperature sensor electrode pads.

In the above-described configuration, preferably, the pair of temperature sensor electrode pads are formed so as to have a same rectangular shape. And when nearest sides facing each other of the respective temperature sensor electrode pads in the second cavity are each referred to as a near end edge, and farthest sides opposed to each other of the respective temperature sensor electrode pads in the second cavity are each referred to as a far end edge, then each outer periphery of the pair of temperature sensor electrode pads may be made up of: a first side including the near end edge; a second side including the far end edge; and a pair of sides for connecting between the corresponding first side and the corresponding second side. The exposed electrodes may include respective extracted portions each extracted toward the nearest internal wall surface of the second cavity from the corresponding far end edge of the pair of temperature sensor electrode pads. Each rectangular-shaped protrusion may be formed on the corresponding first side so as to protrude in a direction approaching each other. When a width of the extracted portion is represented by W1, a side length of the first side is represented by W2, and a width of the protrusion is represented by W3, then a relational expression of W1<W3<W2 may be satisfied.

As shown in the present configuration, by satisfying the relational expression of W1<W3, it is possible to increase the amount of the conductive bonding material that flows to the protrusions more than the amount of the conductive bonding material that flows to the extracted portions, thereby ensuring the amount of the conductive bonding material that remains on the temperature sensor electrode pads. Also, by satisfying the relational expression of W1<W2, it is possible to suppress the amount of the conductive bonding material that flows to the extracted portions, thereby ensuring the amount of the conductive bonding material that remains on the temperature sensor electrode pads. Furthermore, by satisfying the relational expression of W3<W2, it is possible to mount a temperature sensor unit having a different external dimension, thereby producing a general-purpose piezoelectric resonator device. Furthermore, by satisfying the relational expression of W3<W2, the conductive bonding material easily accumulates in the vicinity of base end points (specifically, corner points) of the protrusions that protrude from the near end edges (the first sides). That is, it is possible to accumulate the conductive bonding material on the protrusions of the temperature sensor electrode pads. As a result, when the temperature sensor unit is mounted on the temperature sensor electrode pads, it is possible to easily spread the conductive bonding material over a surface of the temperature sensor unit that comes into contact with the temperature sensor electrode pads. Furthermore, when mounting, it is possible to dispose the temperature sensor unit on the center position of the temperature sensor electrode pads (i.e., it is possible to have the centering function). Like this, by satisfying the relational expression of W3<W2, it is possible to eliminate the deviation in mounting the temperature sensor unit while increasing the bonding strength.

As described above, by satisfying the relational expression of W1<W3<W2, a temperature sensor unit having a different external dimension can be reliably mounted on the temperature sensor electrode pads.

In the above-described configuration, the exposed electrodes formed in the second cavity may have respective cut-out portions, and the cut-out portions may be the respective far end edges.

In this case, when the temperature sensor unit is bonded to the temperature sensor electrode pads via the conductive bonding material, the cut-out portions can restrict a flow direction of the conductive bonding material. Accordingly, it is possible to dispose the temperature sensor unit on a desired mounting position of the temperature sensor electrode pads.

In the above-described configuration, the exposed electrodes formed in the second cavity may have respective slit portions, and the slit portions may be the respective far end edges.

In this case, when the temperature sensor unit is bonded to the temperature sensor electrode pads via the conductive bonding material, the slit portions can restrict a flow direction of the conductive bonding material. Accordingly, it is possible to dispose the temperature sensor unit on a desired mounting position of the temperature sensor electrode pads.

In the above-described configuration, the conductive bonding material may be formed on the side surface of the temperature sensor unit bonded to the temperature sensor electrode pads. Or, in the above-described configuration, the conductive bonding material may spread onto the side surface of the temperature sensor unit bonded to the temperature sensor electrode pads.

In this case, since the conductive bonding material is formed on the side surface of the temperature sensor unit (or, since the conductive bonding material spreads onto the side surface of the temperature sensor unit), it is possible to increase the bonding strength when the temperature sensor unit is bonded to the temperature sensor electrode pads.

In the above-described configuration, the base may have a rectangular parallelepiped shape, and the pair of temperature sensor electrode pads may be disposed along a short-side direction of the base.

In this case, since the pair of temperature sensor electrode pads is disposed along the short-side direction of the base, it is possible to suppress transmission of stress, which is applied to the base, to the temperature sensor unit via the temperature sensor electrode pads. That is, to the base having the rectangular parallelepiped shape, bending stress caused by thermal expansion and the like is applied. The bending stress against the short-side direction of the base is smaller than the bending stress against the long-side direction of the base. Thus, when the bending stress is applied, the center of the long side of the base is bent most. In the present configuration, since the pair of temperature sensor electrode pads is disposed along the short-side direction of the base, it is possible to suppress affection of the bending stress to the temperature sensor unit.

Effect of Invention

With the present invention, it is possible to eliminate the deviation in mounting the temperature sensor unit such as a thermistor element.

MODES FOR CARRYING OUT INVENTION

Hereinafter, embodiments of the present invention will be described with reference to the drawings. Note that the following embodiments show the case in which the present invention is applied to a crystal resonator with a built-in temperature sensor (hereinafter referred to as "crystal resonator") as a piezoelectric resonator device.

Figure 1:
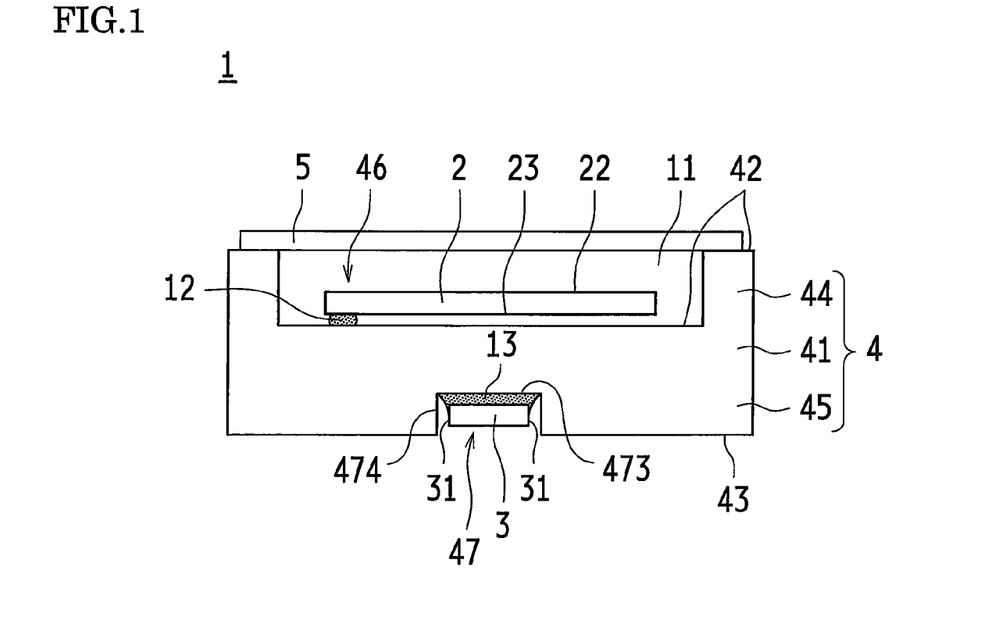
FIG. 1 is a schematic configuration diagram illustrating a crystal resonator according to an embodiment of the present invention, which is a cross-sectional view taken from line A-A of FIG. 2, and also is a cross-sectional view taken from line B-B of FIG. 3.

As shown in FIG. 1, a crystal resonator 1 according to the present embodiment includes: a crystal resonator plate 2 (a piezoelectric resonator plate in the present invention) made of an AT-cut crystal; a temperature sensor unit 3 as a temperature detecting element; a base 4 whose one main surface 42 (a first cavity 46) holds and mounts the crystal resonator plate 2, and whose other main surface 43 (a second cavity 47) holds and mounts the temperature sensor unit 3; and a lid 5 for hermetically sealing the crystal resonator plate 2 held on the base 4.

In the crystal resonator 1, a package is constituted by the base 4 and the lid 5. The base 4 and the lid 5 are bonded via a bonding material (not shown) so that a hermetically sealed internal space 11 is formed. In the internal space 11, the crystal resonator plate 2 is electromechanically bonded to the base 4 using a conductive adhesive 12.

Next, each constituent element of the crystal resonator 1 will be described with reference to FIGS. 1 to 3.

The base 4 is made of ceramic having a rectangular parallelepiped shape with the first cavity 46 and the second cavity 47. As shown in FIGS. 1 to 3, the base 4 is constituted by: a bottom portion 41; a first wall portion 44 extending upward from the bottom portion 41 along the outer periphery of the one main surface 42 of the base 4; and a second wall portion 45 extending downward from the bottom portion 41 along the outer periphery of the other main surface 43 of the base 4. Thus, the base 4 is formed so as to have an H-shape in cross-section. The base 4 is formed by: laminating respective ring-shaped bodies of ceramic (corresponding to the first wall portion 44 and the second wall portion 45) on both main surfaces (the one main surface 42 and the other main surface 43) of a single plate of ceramic (corresponding to the bottom portion) so as to have the H-shape in cross-section; and integrally firing these parts.

A top surface of the first wall portion 44 of the base 4 is a bonding surface for the lid 5. On the bonding surface, a base bonding layer (not shown) is formed so as to be bonded to the lid 5. The base bonding layer has a multiple-layer structure made by laminating a W layer made of W, an Ni layer made of Ni and an Au layer made of Au, in this order.

The base 4 includes the first cavity 46 surrounded by the bottom portion 41 and the first wall portion 44. The crystal resonator plate 2 is mounted on the first cavity 46. As shown in FIGS. 1 and 2, the first cavity 46 is formed so as to have a rectangular shape in plan view. In the present embodiment, the first cavity 46 is formed to have an oblong rectangular shape in plan view.

Also, the base 4 includes the second cavity 47 surrounded by the bottom portion 41 and the second wall portion 45. The temperature sensor unit 3 is mounted on the second cavity 47. As shown in FIGS. 1 and 3, the second cavity 47 is formed so as to have a rectangular shape in plan view. In the present embodiment, the second cavity 47 is formed to have an oblong rectangular shape in plan view, which is smaller than the first cavity 46.

At four corners (four corners in plan view) of the base 4, castellations 48 are formed on the side surfaces of the housing. As shown in FIGS. 2 and 3, the castellations 48 are formed on the respective side surfaces of the housing of the base 4, from the top surface of the first wall portion 44 to the top surface of the second wall portion 45.

On the base 4 are formed: a pair of resonator plate electrode pads 611 and 612 that is electromechanically bonded to respective driving electrodes 24 and 25 of the crystal resonator plate 2; a pair of temperature sensor electrode pads 621 and 622 that is electromechanically bonded to the temperature sensor unit 3; external terminal electrodes 631, 632, 633 and 634 that are electrically connected to external components or external devices; resonator plate wiring patterns 641 and 642 for electrically connecting the resonator plate electrode pads 611 and 612 to the external terminal electrodes 631 and 632; and temperature sensor wiring patterns 651 and 652 for electrically connecting the temperature sensor electrode pads 621 and 622 to the external terminal electrodes 633 and 634. The electrodes of the base 4 are constituted of the resonator plate electrode pads 611 and 612, the temperature sensor electrode pads 621 and 622, the external terminal electrodes 631 to 634, the resonator plate wiring patterns 641 and 642 and the temperature sensor wiring patterns 651 and 652. The electrodes of the base 4 have a configuration made of the same materials as the base bonding layer, and are formed simultaneously with the base bonding layer by being fired integrally with the base 4 after printing of a metallization material such as W and Mo (W is used in the present embodiment). On the external terminal electrodes 631 to 634 and the resonator plate electrode pads 611 and 612, Ni is plated on the metallization, and Au is plated on the Ni plating. Examples of the method of plating include electroplating and electroless plating.

Among the electrodes of the base 4, the resonator plate electrode pads 611 and 612 are formed in the first cavity 46, on one end portion in the long-side direction, and respectively at both end portions in the short-side direction of the one end portion in the long-side direction.

The temperature sensor electrode pads 621 and 622 are formed in the second cavity 47, at both end portions 471 and 472 facing each other in the long-side direction.

The external terminal electrodes 631 and 632 for the crystal resonator plate 2 are formed on the other main surface 43 of the base 4, respectively at one pair of diagonal positions of the four corners. The external terminal electrodes 633 and 634 for the temperature sensor unit 3 are formed on the other main surface 43 of the base 4, respectively at the other pair of diagonal positions of the four corners.

The resonator plate wiring patterns 641 and 642 pass over the one main surface of the bottom portion 41 (i.e., the one main surface 42 of the base 4) and along the respective castellations 48 to connect the external terminal electrodes 631 and 632 to the resonator plate electrode pads 611 and 612. Also, the temperature sensor wiring patterns 651 and 652 pass over the other main surface of the bottom portion 41 (i.e., the other main surface 43 of the base 4) and along the respective castellations 48 to connect the external terminal electrodes 633 and 634 to the temperature sensor electrode pads 621 and 622.

Figure 3:
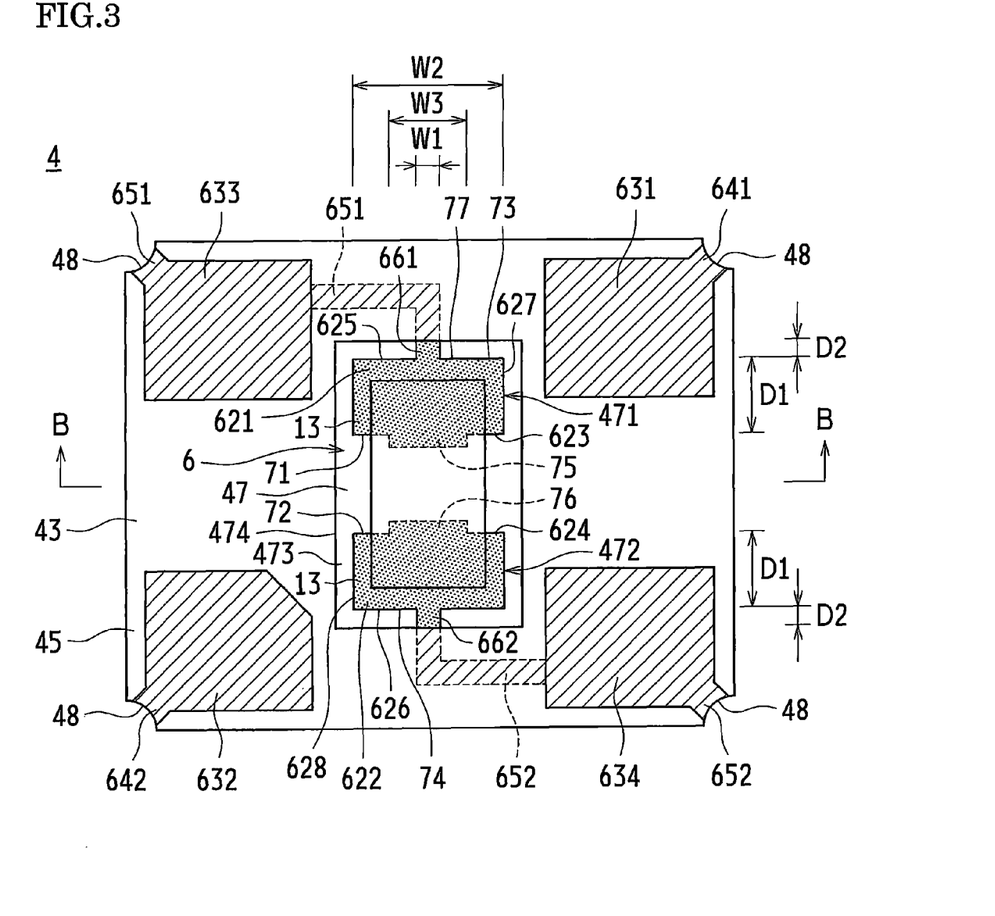
FIG. 3 is a schematic rear view illustrating the base of the crystal resonator according to the embodiment of the present invention.

In the base 4 having the above-described configuration, the second cavity 47 is formed in the other main surface 43, as shown in FIG. 3. In the second cavity 47, electrodes (hereinafter referred to as "exposed electrodes 6") that intersect at least an internal wall surface 474 of the second wall portion 45 are formed so as to be exposed within the second cavity 47. The exposed electrodes 6 include the pair of temperature sensor electrode pads 621 and 622 to which the temperature sensor unit 3 is bonded via a fluid conductive bonding material (solder 13 in the present embodiment), and the temperature sensor wiring patterns 651 and 652 that are the extracted portions 661 and 662 extracted from the pair of temperature sensor electrode pads 621 and 622. Specifically, the pair of temperature sensor electrode pads 621 and 622 is formed respectively on both end portions 471 and 472 facing each other in the long-side direction of the bottom surface of the second cavity 47. The temperature sensor electrode pads 621 and 622 are extracted toward the nearest internal wall surface 474 of the second cavity 47 from the temperature sensor electrode pads 621 and 622 (more specifically, from far end edges 73 and 74). Also, as shown in FIGS. 1 and 3, the solder 13 is formed, in the second cavity 47, so as to entirely cover the exposed electrodes 6 including the temperature sensor electrode pads 621 and 622 to which the temperature sensor unit 3 is bonded. At this time, the solder 13 is formed on a side surface 31 (specifically, up to the intermediate position of the side surface 31 in the height direction as shown in FIG. 1) of the temperature sensor unit 3 bonded to the temperature sensor electrode pads 621 and 622 (that is, the solder 13 spreads onto the side surface 31 of the temperature sensor unit 3). Note that the above relation between the temperature sensor unit 3 and the solder 13 is a preferred example and the present invention is not limited thereto. Another example may be applied as long as the electric connection between the temperature sensor unit 3 and base 4 is ensured. For example, the solder 13 may be spread onto the upper surface of the temperature sensor unit 3, not only onto the side surface 31 of the temperature sensor unit 3. Also, the solder 13 may be formed only on the lower surface of the temperature sensor unit 3.

When the temperature sensor unit 3 is not mounted, the bonding material (the solder 13 as the conductive bonding material) used for bonding the temperature sensor unit 3 to the exposed electrodes 6 is not formed on the exposed electrodes 6. That is, in the present embodiment, the solder 13 as the conductive bonding material is applied to the temperature sensor electrode pads 621 and 622 at the time of bonding the temperature sensor unit 3 to the temperature sensor electrode pads 621 and 622. Thus, in the state of the single base 4, no bonding material is formed on the exposed electrodes 6 to bond the temperature sensor unit 3 to the exposed electrodes 6.

The temperature sensor electrode pads 621 and 622 are formed so as to have the same rectangular shape (in the present embodiment, an oblong rectangular shape in plan view) and respectively disposed, in the second cavity 47, along the short-side direction of the base 4. In these temperature sensor electrode pads 621 and 622, the nearest sides facing each other of the respective temperature sensor electrode pads 621 and 622 are referred to as, respectively, near end edges 71 and 72. Also, in the temperature sensor electrode pads 621 and 622, the farthest sides opposed to each other of the respective temperature sensor electrode pads 621 and 622 are referred to as, respectively, far end edges 73 and 74.

Each outer periphery of the pair of temperature sensor electrode pads 621 and 622 is made up of: corresponding first side 623 or 624 including the corresponding near end edge 71 or 72; corresponding second side 625 or 626 including the corresponding far end edge 73 or 74; and corresponding pair of sides 627 or 628 for connecting between the corresponding first side 623 or 624 to the corresponding second side 625 or 626. Also, on the first sides 623 and 624 (the near end edges 71 and 72), rectangular-shaped protrusions 75 and 76 are respectively formed so as to protrude in the direction approaching each other. The temperature sensor wiring patterns 651 and 652 are extracted from respective centers of the far end edges 73 and 74.

Regarding the above-described exposed electrodes 6, the distance from the near end edge 71 to the far end edge 73/from the near end edge 72 to the far end edge 74 in the temperature sensor electrode pads 621 and 622 is represented by D1. Also, in the temperature sensor electrode pads 621 and 622, the distance from each far end edge 73 and 74 to the nearest corresponding internal wall surface 474 of the second cavity 47 is represented by D2. In the second cavity 47, the width of each extracted portion 661 and 662 is represented by W1. Also, in the second cavity 47, the side length of each first side 623 and 624 is represented by W2.

Also in the second cavity 47, the width of each protrusion 75 and 76 is represented by W3.

Then, in the present embodiment, a relational expression of $2.85 \leq D1/D2 \leq 15.67$ is satisfied in the second cavity 47. Also, a relational expression of $W1 > D2$ is satisfied in the second cavity 47. Also, a relational expression of $W1 < W3 < W2$ is satisfied in the second cavity 47.

Furthermore, in the second cavity 47, the temperature sensor wiring patterns 651 and 652, which have a narrow conduction width, are respectively extracted from the temperature sensor electrode pads 621 and 622 that have a large conduction width. The respective extracting positions are located on both end portions 471 and 472, in the vicinity of the internal wall surface 474 of the second cavity 47. That is, the exposed electrodes 6 in the second cavity 47 have respective shapes including cut-out portions 77 in plan view, in the vicinity of the internal wall surface 474 of the second cavity 47. The cut-out portions are respectively made up of the internal wall surface 474 of the second cavity 47, the far end edges 73 and 74 and the extracted portions 661 and 662. The cut-out portions 77 correspond to the far end edges 73 and 74 (specifically, respective parts of the far end edges 73 and 74).

The lid 5 is made of a metal material. The lid 5 is formed as a single plate having a rectangular parallelepiped shape, the rectangular-shaped single plate in plan view, as shown in FIG. 1. On the lower surface of the lid 5, a bonding layer or a brazing material is formed to be bonded to the base 4. The lid 5 is bonded to the base 4 using a seam welding method, a beam welding method or a metal heat-melting method. Thus, the package of crystal resonator 1 is constituted by the lid 5 and the base 4.

The lid 5 is made up of three layers of metal materials having different thermal expansion coefficients. Specifically, first a lead-free bonding layer made of Sn and Cu, then a nickel layer, and then a Kovar layer are laminated in this order from the underside of the lid 5 (not shown). The lower surface of the lid 5 serves as the bonding surface to the base 4. Also, the bonding layer is formed along the outer periphery of the lower surface of the lid 5, and corresponds to the bonding surface of the first wall portion 44 of the base 4.

Since the downside of the lid 5 is constituted by the bonding layer and the nickel layer, thermal bonding of the lid 5 to the ceramic base 4 is easy compared to the case using other layers. Furthermore, since the Kovar layer is laminated on the bonding layer and the nickel layer, the lid 5 and the ceramic base 4 can have approximately the same thermal expansion coefficient, thereby the thermal deformation of the base 4 and lid 5 can be equivalent. The lid 5 is constituted by laminating the bonding layer, the nickel layer and the Kovar layer in this order, thus, when the lid 5 is bonded to the base 4, the internal space 11 is hermetically sealed by melting the bonding layer in a heating furnace in an inert-gas or vacuum atmosphere.

The crystal resonator plate 2 is constituted by a substrate 21 made of an AT-cut crystal plate. As shown in FIGS. 1 and 2, the crystal resonator plate 2 has an external shape of a single plate having a rectangular parallelepiped shape, and has a substantially rectangular shape in plan view (i.e., both main surfaces 22 and 23 (one main surface 22 and the other main surface 23) are formed so as to have a substantially rectangular shape).

On the crystal resonator plate 2 constituted by the single plate substrate 21 are formed: the pair of driving electrodes 24 and 25 that causes excitation; and extraction electrodes 26 and 27 for electromechanically connecting the pair of driving electrodes 24 and 25 to the resonator plate electrode pads 611 and 612 of the base 4. In the present embodiment, the substrate 21 is the single plate. However, the thickness of the position on which the pair of driving electrodes 24 and 25 is formed can be reduced so as to be compatible with high frequency.

The pair of driving electrodes 24 and 25 is formed respectively on both main surfaces 22 and 23 of the substrate 21 so as to face each other on the center of the substrate 21 in plan view. The pair of driving electrodes 24 and 25 is constituted by, for example, a Cr—Au film made by laminating Cr and Au in this order on the substrate 21. The extraction electrodes 26 and 27 are extracted, from the pair of driving electrodes 24 and 25, each in the vicinity of one side, including the one side, of the substrate 21. The extraction electrodes 26 and 27 are constituted by, for example, a Cr—Au film made by laminating Cr and Au in this order on the substrate 21, similarly to the driving electrodes 24 and 25.

A thermistor element, which serves as the temperature detecting element is used for the temperature sensor unit 3 disposed in the second cavity 47, as shown in FIGS. 1 and 3. A housing of the temperature sensor unit 3 (the thermistor element) has a rectangular parallelepiped shape.

Figure 2:
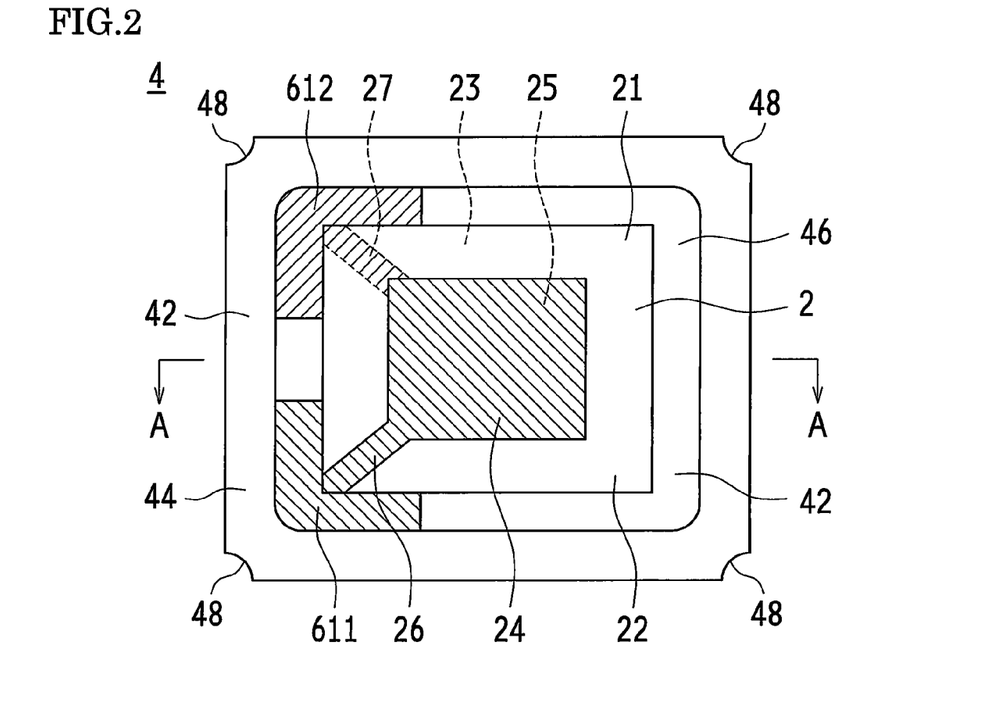
FIG. 2 is a schematic plan view illustrating a base of the crystal resonator according to the embodiment of the present invention.

In the crystal resonator 1 having the above-described configuration, the crystal resonator plate 2 is bonded to the base 4 by the conductive adhesive 12, as shown in FIGS. 1-3. By the bond, the driving electrodes 24 and 25 of the crystal resonator plate 2 are electromechanically connected to the resonator plate electrode pads 611 and 612 of the base 4 via the extraction electrodes 26 and 27 and the conductive adhesive 12, thus, the crystal resonator plate 2 is mounted on the base 4. After that, the temperature sensor unit 3 is pressed and bonded via the solder 13 to the temperature sensor electrode pads 621 and 622 in the second cavity 47 of the base 4 on which the crystal resonator plate 2 is mounted. Thus, the temperature sensor unit 3 is mounted on the base 4. As shown in FIGS. 1 and 3, by mounting the temperature sensor unit 3 on the base 4, the solder 13 is formed, in the second cavity 47, so as to entirely cover the exposed electrodes 6 including the temperature sensor electrode pads 621 and 622 to which the temperature sensor unit 3 is bonded. That is, when the temperature sensor unit 3 is bonded to the pair of temperature sensor electrode pads 621 and 622, the solder 13 is formed over the entire surface of the exposed electrodes 6. At this time, the solder 13 is formed on the side surface 31 (specifically, up to the intermediate position of the side surface 31 in the height direction) of the temperature sensor unit 3 bonded to the temperature sensor electrode pads 621 and 622. That is, when the temperature sensor unit 3 is bonded to the pair of temperature sensor electrode pads 621 and 622, the solder 13 is spread onto the side surface 31 of the temperature sensor unit 3.

Then, the lid 5 is electromechanically connected to the base 4 including the mounted crystal resonator plate 2 and the mounted temperature sensor unit 3 by heat-melting (specifically, by the seam welding, the metal heat-melting, the beam welding or the like) via the bonding material. Thus, the crystal resonator 1 is produced, in which the crystal resonator plate 2 is hermetically sealed. In the present embodiment, the conductive adhesive 12 is used for bonding, however, the present invention is not limited thereto. An ultrasonic FCB (flip chip bonding) method may be used. Also, a conductive bump such as a plated bump may be used as the conductive adhesive 12.

The crystal resonator 1 according to the present embodiment has a specific dimension in the following aspects (the first aspect to the third aspect).

In the first aspect, the crystal resonator 1 (the package constituted by the base 4 and the lid 5) has the plane size of 2.5 mm×2.0 mm, D1 of 0.37 to 0.47 mm (center value: 0.42 mm), D2 of 0.03 to 0.13 mm (center value: 0.08 mm), W1 of 0.07 to 0.17 mm (center value: 0.12 mm), W2 of 0.40 to 0.50 mm (center value: 0.45 mm), W3 of 0.15 to 0.25 mm (center value: of 0.20 mm), D1/D2 of 2.85 to 15.67 (center value: 5.25), and the dimension of the temperature sensor unit 3 of 0.60×0.30×0.30 (length×width×height).

In the second aspect, the crystal resonator 1 (the package constituted by the base 4 and the lid 5) has the plane size of 2.0 mm×1.6 mm, D1 of 0.32 to 0.38 mm (center value: 0.35 mm), D2 of 0.04 to 0.10 mm (center value: 0.07 mm), W1 of 0.09 to 0.15 mm (center value: 0.12 mm), W2 of 0.42 to 0.48 mm (center value: 0.45 mm), W3 of 0.17 to 0.23 mm (center value: 0.20 mm), D1/D2 of 3.20 to 9.50 (center value: 5.00), and the dimension of the temperature sensor unit 3 of 0.60×0.30×0.15 (length×width×height (max)).

In the third aspect, the package constituted by the base 4 and the lid 5 has the plane size of 1.6 mm×1.2 mm, D1 of 0.29 to 0.35 mm (center value: 0.32 mm), D2 of 0.03 to 0.09 mm (center value: 0.06 mm), W1 of 0.07 to 0.13 mm (center value: 0.10 mm), W2 of 0.32 to 0.38 mm (center value: 0.35 mm), D1/D2 of 3.22 to 11.67 (center value: 5.33), and the dimension of the temperature sensor unit 3 of 0.4×0.2×0.1 or 0.2 (length×width×height (max)). In the third aspect, the temperature sensor unit 3 having the dimension of 0.60× 0.30×0.15 (length×width×height (max)) may be mounted.

As described above, in the present embodiment, it is possible to obtain an effect when the relational expression of 2.85≤D1/D2≤15.67 is satisfied. However, in order to obtain a better effect, it is necessary to satisfy the relational expression of 3.20≤D1/D2≤11.67, as shown in the first aspect to the third aspect. Specifically, as one aspect, it is necessary to satisfy the relational expression of 2.85≤D1/D2≤15.67 relative to the package size of 2.5 mm×2.0 mm, to satisfy the relational expression of 3.20≤D1/D2≤9.50 relative to the package size of 2.0 mm×1.6 mm, and to satisfy the relational expression of 3.22≤D1/D2≤11.67 relative to the package size of 1.6 mm×1.2 mm, as shown in the first aspect to the third aspect.

With the present embodiment, it is possible to eliminate the deviation in mounting the thermistor element that serves as the temperature sensor unit 3. That is, in the present embodiment, the exposed electrodes 6 are formed on a bottom surface 473 of the second cavity 47 so as to be exposed within the second cavity 47. The exposed electrodes 6 include the pair of temperature sensor electrode pads 621 and 622. The solder 13 is formed so as to cover the entire surface of the exposed electrodes 6 including the temperature sensor electrode pads 621 and 622 to which the temperature sensor unit 3 is bonded. Thus, regardless the position on which the solder 13 is applied, the temperature sensor unit 3 can be mounted on a desired position. Especially, the present embodiment is suitable for mounting the temperature sensor unit such as a general-purpose thermistor element in the second cavity 47 corresponding to downsizing of the piezoelectric resonator device including the crystal resonator 1.

Also, in the present embodiment, when D1/D2 equals to 2.85, 5.00, 5.25, 5.33, 9.00 or 15.67, it was confirmed that no deviation occurs in mounting the temperature sensor unit 3 on the temperature sensor electrode pads 621 and 622.

Also, since the relational expression of W1>D2 is satisfied in the second cavity 47, the solder 13 easily flows (spreads) on the exposed electrodes 6 when the temperature sensor unit 3 is bonded to the temperature sensor electrode pads 621 and 622 via the solder 13. As a result, a bonding strength of the temperature sensor unit 3 to the temperature sensor electrode pads 621 and 622 can be increased. Especially, the bonding strength is further increased in the aspect in which the solder 13 is formed on the side surface 31 of the temperature sensor unit 3 bonded to the temperature sensor electrode pads 621 and 622. On the other hand, when the relational expression of W1≤D2 is satisfied in the second cavity 47, the solder 13 is less likely to flow (spread) on the exposed electrodes 6 when the temperature sensor unit 3 is bonded to the temperature sensor electrode pads 621 and 622 via the solder 13. As a result, the bonding strength of the temperature sensor unit 3 to the temperature sensor electrode pads 621 and 622 is decreased. This relates to the fact that when W1 is relatively small to D2, the solder 13 is less likely to spread on the temperature sensor electrode pads 621 and 622.

Also, as shown in the present embodiment, by satisfying the relational expression of W1<W3, it is possible to increase the amount of the solder 13 that flows to the protrusions 75 and 76 more than the amount of the solder 13 that flows to the extracted portions 661 and 662, thereby ensuring the amount of the solder 13 that remains on the temperature sensor electrode pads 621 and 622. Also, by satisfying the relational expression of W1<W2, it is possible to suppress the amount of the solder 13 that flows to the extracted portions 661 and 662, thereby ensuring the amount of the solder 13 that remains on the temperature sensor electrode pads 621 and 622. Furthermore, by satisfying the relational expression of W3<W2, it is possible to mount the temperature sensor unit 3 having a different external dimension, thereby producing a general-purpose piezoelectric resonator device including the crystal resonator 1. Furthermore, by satisfying the relational expression of W3<W2, the solder 13 easily accumulates in the vicinity of the base end points (specifically, the corner points) of the protrusions 75 and 76 that protrude from the near end edges 71 and 72 (the first sides 623 and 624). That is, it is possible to accumulate the solder 13 on the protrusions 75 and 76 of the temperature sensor electrode pads 621 and 622. As a result, when the temperature sensor unit 3 is mounted on the temperature sensor electrode pads 621 and 622, it is possible to easily spread the solder 13 over the surface of the temperature sensor unit 3 that comes into contact with the temperature sensor electrode pads 621 and 622. Furthermore, when mounting, it is possible to dispose the temperature sensor unit 3 on the center position of the temperature sensor electrode pads 621 and 622 (i.e., it is possible to have the centering function). Like this, by satisfying the relational expression of W3<W2, it is possible to eliminate the deviation in mounting the temperature sensor unit 3 while increasing the bonding strength.

As described above, by satisfying the relational expression of W1<W3<W2, the temperature sensor unit 3 having a different external dimension can be reliably mounted on the temperature sensor electrode pads 621 and 622.

Furthermore, since the base 4 has the rectangular parallelepiped shape and the pair of temperature sensor electrode pads 621 and 622 is disposed along the short-side direction of the base 4, it is possible to suppress transmission of stress, which is applied to the base 4, to the temperature sensor unit 3 via the temperature sensor electrode pads 621 and 622. That is, to the base 4 having the rectangular parallelepiped shape, bending stress caused by thermal expansion and the like is applied. The bending stress against the short-side direction of the base 4 is smaller than the bending stress against the long-side direction of the base 4. Thus, when the bending stress is applied, the center of the long side of the base 4 is bent most. In the present embodiment, since the pair of temperature sensor electrode pads 621 and 622 is disposed along the short-side direction of the base 4, it is possible to suppress affection of the bending stress to the temperature sensor unit 3.

Furthermore, the exposed electrodes 6 formed in the second cavity 47 have the cut-out portions 77 that correspond to the respective far end edges 73 and 74. Thus, when the temperature sensor unit 3 is bonded to the temperature sensor electrode pads 621 and 622 via the solder 13, the cut-out portions 77 can restrict the flow direction of the solder 13. Accordingly, it is possible to dispose the temperature sensor unit 3 on the desired mounting position of the temperature sensor electrode pads 621 and 622.

Also, since the resonator plate wiring patterns 641 and 642 are extracted from the respective centers of the far end edges 73 and 74, if the temperature sensor unit 3 is pulled in the flow direction of the solder, tensile stress is offset on the pair of temperature sensor electrode pads 621 and 622. Thus, it is possible to dispose the temperature sensor unit 3 on a desired mounting position of the temperature sensor electrode pads 621 and 622.

Also, since the solder 13 is formed on the side surface 31 of the temperature sensor unit 3 bonded to the temperature sensor electrode pads 621 and 622, it is possible to increase the bonding strength when the temperature sensor unit 3 is bonded to the temperature sensor electrode pads 621 and 622.

In the present embodiment, the crystal resonator is applied as a piezoelectric resonator device, however, the present invention is not limited thereto. Another device may be used to the extent that such a device is a piezoelectric resonator device in which the driving electrodes of the piezoelectric resonator plate that cause piezoelectric resonance are hermetically sealed. For example, a crystal oscillator may be used.

In the present embodiment, the solder 13 is used as the conductive bonding material. However, another bonding material such as a conductive adhesive may also be used provided that it has fluidity. Also, the temperature sensor unit 3 may be bonded to the base 4 via the conductive bonding material (the solder 13 and the like) in a state in which an under fill (liquid curable resin) is interposed between the temperature sensor unit 3 and the bottom surface 473 of the second cavity 47.

In the present embodiment, the temperature sensor unit 3 is bonded, in a state of being exposed outside, to the temperature sensor electrode pads 621 and 622 via the solder 13. However, the present invention is not limited thereto. After bonding the temperature sensor unit 3 to the temperature sensor electrode pads 621 and 622, part (e.g., the side surface) or the whole of the temperature sensor unit 3 may be covered by resin.

In the present embodiment, on the base 4 are formed: the external terminal electrodes 631 and 632 electrically connected to the resonator plate electrode pads 611 and 612; and the external terminal electrodes 633 and 634 electrically connected to the temperature sensor electrode pads 621 and 622. However, the present invention is not limited thereto. An external terminal electrode for another purpose such as for grounding may be formed on the other main surface 43 (except for in the second cavity 47) of the base 4. Also, the external terminal electrode for grounding may be formed on the base 4 so as to commonly connect the lid 5 made of or covered by a metal, the temperature sensor electrode pads 621 and 622 and the external terminal electrode for grounding.

In the present embodiment, the thermistor element is used as the temperature sensor unit 3 as an example. However, the present invention is not limited thereto. For example, a unit in which the thermistor element is embedded, a diode, a transistor and the like may be used.

Figure 4:
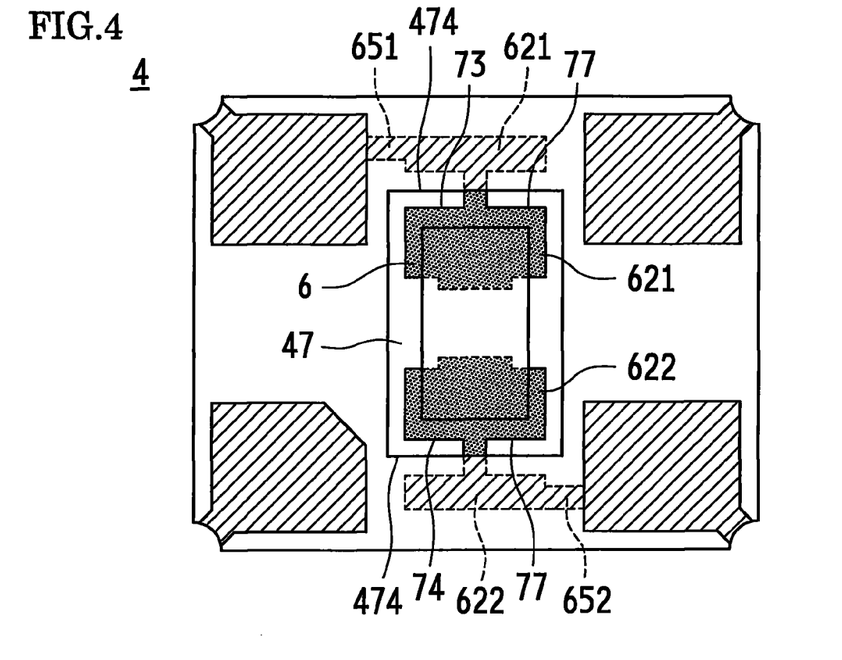
FIG. 4 is a schematic rear view illustrating a base of a crystal resonator according to another embodiment.

In the present embodiment, the temperature sensor electrode pads 621 and 622 are used, which are formed only in the second cavity 47. However, the present invention is not limited thereto. As shown in FIG. 4, the temperature sensor electrode pads 621 and 622 may extend outside the second cavity 47.

In the embodiment shown in FIG. 4, the cut-out portions 77 are formed in the temperature sensor electrode pads 621 and 622. Similarly to the cut-out portions 77 shown in FIG. 3, the exposed electrodes 6 in the second cavity 47 have respective shapes including cut-out portions 77 in plan view, in the vicinity of the internal wall surface 474 of the second cavity 47. The cut-out portions 77 are respectively made up of the internal wall surface 474 of the second cavity 47, the far end edges 73 and 74 and the extracted portions 661 and 662. In addition to the above configuration, the cut-out portions 77 shown in FIG. 4 are formed inside and outside the second cavity 47, and the temperature sensor wiring patterns 651 and 652 are extracted from the temperature sensor electrode pads 621 and 622 in the outside of the second cavity 47. Thus, the cut-out portions 77 shown in FIG. 4 have two features, and are disposed respectively in the positions corresponding to the far end edges 73 and 74 in FIG. 3. That is, in the embodiment as shown in FIG. 4, the far end edges 73 and 74 of the temperature sensor electrode pads 621 and 622 in the second cavity 47 correspond to the far end edges 73 and 74 in FIG. 3.

Figure 5:
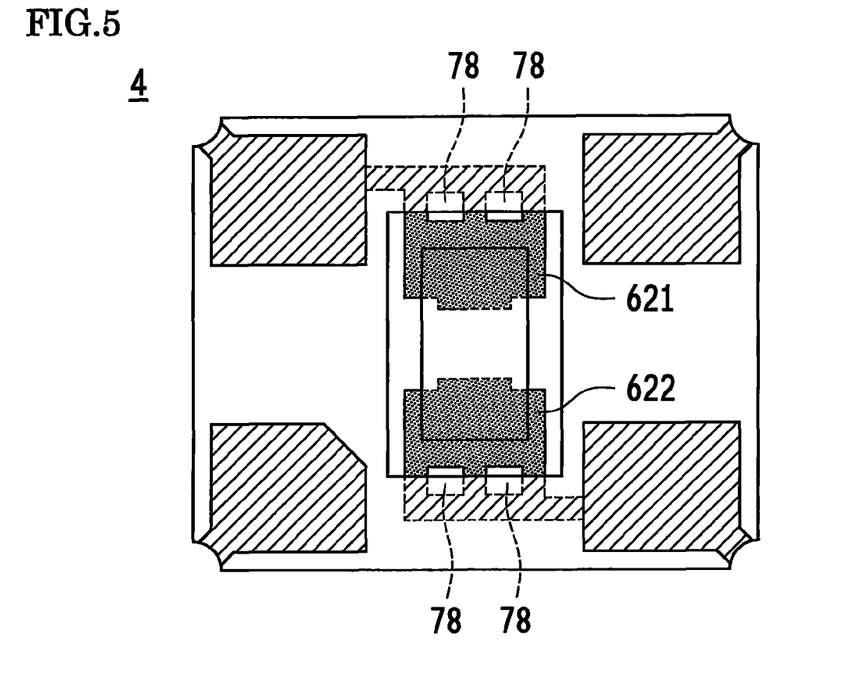
FIG. 5 is a schematic rear view illustrating a base of a crystal resonator according to another embodiment.

The present embodiment includes the cut-out portions 77 as shown in FIGS. 3 and 4 as its elements. However, the present invention is not limited thereto. Slit portions 78 as shown in FIG. 5 may be applied instead of the cut-out portions 77. In this case also, it is possible to obtain the same function and effect as in the cut-out portions 77 in FIGS. 3 and 4. Furthermore, compared to the cut-out portion 77 in FIGS. 3 and 4, the slit portions 78 in FIG. 5 can ensure, apart from the conduction route by the cut-out portion 77, the conduction routes on both the outsides of the cut-out portion 77. For this reason, with the configuration having the slit portions 78, three conduction routes exist. Thus, the solder easily spreads on both the outside of the temperature sensor electrode pads 621 and 622. And furthermore, since the pair of temperature sensor electrode pads 621 and 622 is formed so as to be directly opposed to each other, the temperature sensor unit 3 hardly rotates when the temperature sensor unit 3 is mounted on the base 4.

Figure 6:
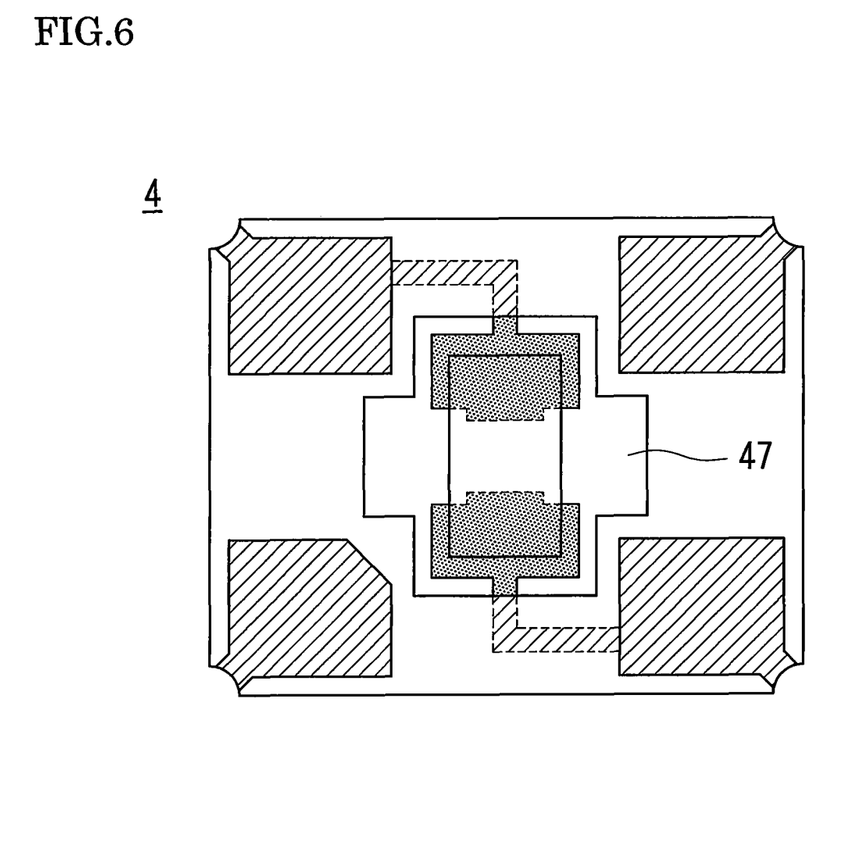
FIG. 6 is a schematic rear view illustrating a base of a crystal resonator according to another embodiment.

In the present embodiment, the second cavity 47 is formed to have the oblong rectangular shape in plan view, as shown in FIGS. 3 to 5. However, the present invention is not limited thereto. The second cavity 47 may have a cruciform shape in plan view as shown in FIG. 6. Currently, the temperature sensor unit 3 is mounted on the base 4 using a mounter (not shown). With the embodiment as shown in FIG. 6, it is easy to mount the temperature sensor unit 3 on the base 4 by the mounter.

The present invention can be embodied in other forms without departing from the spirit or essential characteristics thereof. The foregoing embodiments are therefore to be considered in all respects as illustrative and not restrictive. That is, the present invention provides a piezoelectric resonator device exemplarily embodied by the above described embodiments.

The scope of the invention is indicated by the appended claims rather than by the foregoing description. Furthermore, all modifications and changes that come within the meaning and range of equivalency of the claims are intended to be embraced therein.

This application claims priority based on Patent Application No. 2012-252500 filed in Japan on Nov. 16, 2012. The entire contents thereof are hereby incorporated in this application by reference.

INDUSTRIAL APPLICABILITY

The present invention is applicable to a piezoelectric resonator device.

DESCRIPTION OF REFERENCE NUMERALS

1 Crystal resonator
11 Internal space
12 Conductive adhesive
13 Solder
2 Crystal resonator plate
21 Substrate
22 One main surface
23 Other main surface
24, 25 Driving electrode
26, 27 Extraction electrode
3 Temperature sensor unit
31 Side surface of temperature sensor unit
4 Base
41 Bottom portion
42 One main surface
43 Other main surface
44 First wall portion
45 Second wall portion
46 First cavity
47 Second cavity
471, 472 End portion of second cavity
473 Bottom surface of second cavity
474 Internal wall surface of second cavity
48 Castellation
5 Lid
6 Exposed electrode
611, 612 Resonator plate electrode pad
621, 622 Temperature sensor electrode pad
623, 624 First side
625, 626 Second side
627, 628 Side
631, 632, 633, 634 External terminal electrode
641, 642 Resonator plate wiring pattern
651, 652 Temperature sensor wiring pattern
661, 662 Extracted portion
71, 72 Near end edge
73, 74 Far end edge
75, 76 Protrusion
77 Cut-out portion
78 Slit portion

The invention claimed is:

1. A piezoelectric resonator device, comprising:
a base for mounting a piezoelectric resonator plate; and
a lid for hermetically sealing the piezoelectric resonator plate,
wherein the piezoelectric resonator device is constituted by: a bottom portion; a first wall portion extending upward from the bottom portion along an outer periphery of one main surface of the base; and a second wall portion extending downward from the bottom portion along an outer periphery of the other main surface of the base,
wherein a first cavity is formed by being surrounded by the bottom portion and the first wall portion so as to mount the piezoelectric resonator plate, and a second cavity is formed by being surrounded by the bottom portion and the second wall portion so as to mount a temperature sensor unit as a temperature detecting element,
wherein, on a bottom surface of the second cavity, exposed electrodes that intersect at least an internal wall surface of the second wall portion are formed so as to be exposed within the second cavity, the exposed electrodes including a pair of temperature sensor electrode pads to which the temperature sensor unit is bonded via a fluid conductive bonding material,
wherein the conductive bonding material is formed so as to cover an entire surface of the exposed electrodes including the temperature sensor electrode pads to which the temperature sensor unit is bonded,
wherein the pair of temperature sensor electrode pads are formed so as to have a same shape, and
wherein, when nearest sides facing each other of the respective temperature sensor electrode pads in the second cavity are each referred to as a near end edge, and farthest sides opposed to each other of the respective temperature sensor electrode pads in the second cavity are each referred to as a far end edge, and when a distance from the near end edge to the far end edge of each of the temperature sensor electrode pads is represented by D1 and a distance from the far end edge to the nearest internal wall surface of the second cavity is represented by D2, then a relational expression of $2.85 <= D1/D2 <= 15.67$ is satisfied in the second cavity.

2. The piezoelectric resonator device according to claim 1, wherein the exposed electrodes formed in the second cavity have respective cut-out portions, and wherein the cut-out portions are the respective far end edges.

3. The piezoelectric resonator device according to claim 2, wherein the conductive bonding material is formed on a side surface of the temperature sensor unit bonded to the temperature sensor electrode pads.

4. The piezoelectric resonator device according to claim 2, wherein the base has a rectangular parallelepiped shape, and wherein the pair of temperature sensor electrode pads are disposed along a short-side direction of the base.

5. The piezoelectric resonator device according to claim 1, wherein the conductive bonding material is formed on a side surface of the temperature sensor unit bonded to the temperature sensor electrode pads.

6. The piezoelectric resonator device according to claim 1, wherein the base has a rectangular parallelepiped shape, and wherein the pair of temperature sensor electrode pads are disposed along a short-side direction of the base.

7. A piezoelectric resonator device, comprising:
a base for mounting a piezoelectric resonator plate; and
a lid for hermetically sealing the piezoelectric resonator plate,
wherein the piezoelectric resonator device is constituted by: a bottom portion; a first wall portion extending upward from the bottom portion along an outer periphery of one main surface of the base; and a second wall portion extending downward from the bottom portion along an outer periphery of the other main surface of the base, wherein a first cavity is formed by being surrounded by the bottom portion and the first wall portion so as to mount the piezoelectric resonator plate, and a second cavity is formed by being surrounded by the bottom portion and the second wall portion so as to mount a temperature sensor unit as a temperature detecting element, wherein, on a bottom surface of the second cavity, exposed electrodes that intersect at least an internal wall surface of the second wall portion are formed so as to be exposed within the second cavity, the exposed electrodes including a pair of temperature sensor electrode pads to which the temperature sensor unit is bonded via a fluid conductive bonding material, wherein the conductive bonding material is formed so as to cover an entire surface of the exposed electrodes including the temperature sensor electrode pads to which the temperature sensor unit is bonded, wherein the pair of temperature sensor electrode pads are formed so as to have a same rectangular shape, and wherein, when nearest sides facing each other of the respective temperature sensor electrode pads in the second cavity are each referred to as a near end edge, and farthest sides opposed to each other of the respective temperature sensor electrode pads in the second cavity are each referred to as a far end edge, then each outer periphery of the pair of temperature sensor electrode pads is made up of: a first side including the near end edge; a second side including the far end edge; and a pair of sides for connecting between the corresponding first side and the corresponding second side, wherein the exposed electrodes include respective extracted portions each extracted toward the nearest internal wall surface of the second cavity from the corresponding far end edge of the pair of temperature sensor electrode pads, and wherein, in the temperature sensor electrode pads, when a distance from the far end edge to the nearest internal wall surface of the second cavity is represented by $D2$, and when a width of the extracted portion is represented by $W1$, then a relational expression of $W1 > D2$ is satisfied in the second cavity.

8. The piezoelectric resonator device according to claim 7, wherein the conductive bonding material is formed on a side surface of the temperature sensor unit bonded to the temperature sensor electrode pads.

9. The piezoelectric resonator device according to claim 7, wherein the base has a rectangular parallelepiped shape, and wherein the pair of temperature sensor electrode pads are disposed along a short-side direction of the base.

10. A piezoelectric resonator device, comprising:
a base for mounting a piezoelectric resonator plate; and
a lid for hermetically sealing the piezoelectric resonator plate,
wherein the piezoelectric resonator device is constituted by: a bottom portion; a first wall portion extending upward from the bottom portion along an outer periphery of one main surface of the base; and a second wall portion extending downward from the bottom portion along an outer periphery of the other main surface of the base, wherein a first cavity is formed by being surrounded by the bottom portion and the first wall portion so as to mount the piezoelectric resonator plate, and a second cavity is formed by being surrounded by the bottom portion and the second wall portion so as to mount a temperature sensor unit as a temperature detecting element, wherein, on a bottom surface of the second cavity, exposed electrodes that intersect at least an internal wall surface of the second wall portion are formed so as to be exposed within the second cavity, the exposed electrodes including a pair of temperature sensor electrode pads to which the temperature sensor unit is bonded via a fluid conductive bonding material, wherein the conductive bonding material is formed so as to cover an entire surface of the exposed electrodes including the temperature sensor electrode pads to which the temperature sensor unit is bonded, wherein the pair of temperature sensor electrode pads are formed so as to have a same rectangular shape, wherein, when nearest sides facing each other of the respective temperature sensor electrode pads in the second cavity are each referred to as a near end edge, and farthest sides opposed to each other of the respective temperature sensor electrode pads in the second cavity are each referred to as a far end edge, then each outer periphery of the pair of temperature sensor electrode pads is made up of: a first side including the near end edge; a second side including the far end edge; and a pair of sides for connecting between the corresponding first side and the corresponding second side, wherein each rectangular-shaped protrusion is formed on the corresponding first side so as to protrude in a direction approaching each other.

11. The piezoelectric resonator device according to claim 10,
wherein the exposed electrodes include respective extracted portions each extracted toward the nearest internal wall surface of the second cavity from the corresponding far end edge of the pair of temperature sensor electrode pads,
wherein, when a width of the extracted portion is represented by $W1$, a side length of the first side is represented by $W2$, and a width of the protrusion is represented by $W3$, then a relational expression of $W1 < W3 < W2$ is satisfied.

12. The piezoelectric resonator device according to claim 10, wherein the conductive bonding material is formed on a side surface of the temperature sensor unit bonded to the temperature sensor electrode pads.

13. The piezoelectric resonator device according to claim 10, wherein the base has a rectangular parallelepiped shape, and wherein the pair of temperature sensor electrode pads are disposed along a short-side direction of the base.

* * * * *